United States Patent
Kim et al.

(10) Patent No.: US 12,407,929 B2
(45) Date of Patent: Sep. 2, 2025

(54) SENSOR-DRIVING ACTUATOR

(71) Applicant: JAHWA ELECTRONICS CO., LTD., Cheongju-si (KR)

(72) Inventors: Hee Seung Kim, Seoul (KR); Ki Hoon Jeon, Incheon (KR); Min Seok Han, Siheung-si (KR)

(73) Assignee: JAHWA ELECTRONICS CO., LTD., Cheongju-si (KR)

(*) Notice: Subject to any disclaimer, the term of this patent is extended or adjusted under 35 U.S.C. 154(b) by 10 days.

(21) Appl. No.: 18/277,226

(22) PCT Filed: Jul. 20, 2022

(86) PCT No.: PCT/KR2022/010645
§ 371 (c)(1),
(2) Date: Aug. 15, 2023

(87) PCT Pub. No.: WO2023/043037
PCT Pub. Date: Mar. 23, 2023

(65) Prior Publication Data
US 2024/0147071 A1 May 2, 2024

(30) Foreign Application Priority Data
Sep. 17, 2021 (KR) .......... 10-2021-0125146

(51) Int. Cl.
*H04N 23/68* (2023.01)
*G03B 3/10* (2021.01)
(Continued)

(52) U.S. Cl.
CPC ............ *H04N 23/687* (2023.01); *G03B 3/10* (2013.01); *H04N 23/54* (2023.01); *H04N 23/55* (2023.01);
(Continued)

(58) Field of Classification Search
None
See application file for complete search history.

(56) References Cited

U.S. PATENT DOCUMENTS

| | | | |
|---|---|---|---|
| 2021/0092297 A1* | 3/2021 | Smyth | H04N 23/67 |
| 2024/0214660 A1* | 6/2024 | Park | H04N 23/68 |
| 2024/0223900 A1* | 7/2024 | Rho | H04N 23/54 |

FOREIGN PATENT DOCUMENTS

| | | | | |
|---|---|---|---|---|
| CN | 114697477 A | * | 7/2022 | G03B 13/36 |
| KR | 20170071097 A | | 6/2017 | |

(Continued)

*Primary Examiner* — Paul M Berardesca
(74) *Attorney, Agent, or Firm* — Bayramoglu Law Offices LLC

(57) ABSTRACT

A sensor-driving actuator is provided, which includes an image sensor; an OIS carrier to which the image sensor is mounted and which moves the image sensor in at least one of a first direction perpendicular to the optical axis direction or a second direction perpendicular to the first direction; an AF carrier for moving the image sensor in the optical axis direction; a first housing accommodating the OIS carrier and the AF carrier; a flexible circuit board which extends from an upper portion of the OIS carrier to which the image sensor is mounted, and which bends, along the outer surface of the first housing, in each of the optical axis direction and the direction perpendicular to the optical axis direction; and a second housing accommodating the first housing.

14 Claims, 8 Drawing Sheets

(51) Int. Cl.
  *H04N 23/54*    (2023.01)
  *H04N 23/55*    (2023.01)
  *H04N 23/57*    (2023.01)
  *H04N 23/67*    (2023.01)
  *H05K 1/02*    (2006.01)
  *H05K 1/14*    (2006.01)

(52) U.S. Cl.
  CPC ............ *H04N 23/57* (2023.01); *H04N 23/67* (2023.01); *H05K 1/028* (2013.01); *H05K 1/147* (2013.01); *H05K 2201/056* (2013.01)

(56) References Cited

FOREIGN PATENT DOCUMENTS

| | | | |
|---|---|---|---|
| KR | 20170110298 A | 10/2017 | |
| KR | 20170141523 A | 12/2017 | |
| KR | 20210020731 A | 2/2021 | |
| KR | 20210026659 A | 3/2021 | |
| KR | 20210061096 A | 5/2021 | |

* cited by examiner

SENSOR-DRIVING ACTUATOR

CROSS REFERENCE TO THE RELATED APPLICATIONS

This application is the national phase entry of International Application No. PCT/KR2022/010645, filed on Jul. 20, 2022, which is based upon and claims priority to Korean Patent Application No. 10-2021-0125146, filed on Sep. 17, 2021, the entire contents of which are incorporated herein by reference.

TECHNICAL FIELD

The present invention relates to a camera actuator, and more particularly, to an actuator capable of implementing autofocus and optical image stabilization functions by driving a sensor.

BACKGROUND

As a hardware technology for image processing advances and a user need for image capturing and the like increases, functions such as autofocus (AF) and optical image stabilization (OIS) are implemented in stand-alone camera devices as well as camera modules mounted in mobile terminals such as mobile phones and smartphones.

The autofocus function refers to a function of adjusting a focal length with respect to a subject by linearly moving a carrier, which is equipped with a lens and the like, in an optical axis direction, thereby creating a clear image on an image sensor (CMOS, CCD, etc.) provided at a rear end of the lens.

In addition, the optical image stabilization function refers to a function of improving clarity of an image by adaptively moving a carrier, which is equipped with a lens, to compensate for swaying of the lens when the lens sways because of a hand shake problem.

One of the representative methods of implementing the AF or OIS function is a method of installing a magnet (coil) on a movable body (carrier), installing a coil (magnet) on a stationary body (housing, another type of carrier, or the like), and then generating an electromagnetic force between the coil and the magnet, thereby moving the movable body in the optical axis direction or a direction perpendicular to the optical axis.

Meanwhile, there is a device that connects a wire to the carrier to implement a function of physically supporting the carrier and a function of restoring a position of the carrier. However, the wire of the device is easily deformed in physical properties by internal and external environments, which degrades driving precision. In particular, in case that a weight and size of the lens are increased by high specifications of the lens, the driving performance may be further degraded.

Recently, to solve the problem with the wire-type device, a configuration has been applied in which a ball is interposed between the movable body and the stationary body to consistently maintain an appropriate spacing distance between the movable body and the stationary body, and a frictional force is minimized by a rotational motion of the ball and a point contact with the ball, such that the carrier moves more smoothly and accurately.

In the case of the device or actuator with the integrated AF and OIS function, the AF needs to be moved in the optical axis direction, and the OIS needs to be moved in the direction perpendicular to the optical axis. Therefore, the device or actuator is implemented to have a complex physical structure in which AF and OIS carriers are stacked on each other.

The actuator in the related art performs the optical image stabilization by moving a lens module in the direction perpendicular to the optical axis direction. However, because the lens module accounts for most of the weight of the camera module, there is a problem in that movement accuracy of the lens module and performance reliability of the camera module deteriorate.

SUMMARY

Disclosure

Technical Problem

The present invention has been made in an effort to solve the above-mentioned problem, and an object of the present invention is to provide a sensor-driving actuator capable of comparatively easily implementing OIS and AF and improving reliability of a camera module by driving a sensor instead of driving a lens module.

Another object of the present invention is to provide a sensor-driving actuator capable of facilitating a movement of an image sensor at the time of implementing OIS and AF by adopting a flexible circuit board having a bent structure.

The other objects and advantages of the present invention may be understood from the following descriptions and more clearly understood from the embodiment of the present invention. In addition, the objects and advantages of the present invention may be realized by components and a combination of the components disclosed in claims.

Technical Solution

To achieve the above-mentioned objects, the present invention provides a sensor-driving actuator including: an image sensor; an OIS carrier on which the image sensor is mounted, the OIS carrier being configured to move the image sensor in at least one of a first direction, which is perpendicular to an optical axis direction, and a second direction perpendicular to the first direction; an AF carrier configured to move the image sensor in the optical axis direction; a first housing configured to accommodate the OIS carrier and the AF carrier; a flexible circuit board extending from an upper portion of the OIS carrier on which the image sensor is mounted, and bent in the optical axis direction and a direction perpendicular to the optical axis direction along an outer surface of the first housing; and a second housing configured to accommodate the first housing.

In this case, at least a part of the flexible circuit board may be disposed between an outer surface of the first housing and an inner surface of the second housing.

In addition, a movement space for the flexible circuit board may be provided between the outer surface of the first housing and the inner surface of the second housing.

In addition, the direction perpendicular to the optical axis direction may include first and second directions perpendicular to each other, and the flexible circuit board may move in at least one of the optical axis direction and the first and second directions in the movement space as the image sensor moves.

In addition, the flexible circuit board may include: first and second board members attached to two opposite sides of the image sensor; third and fourth board members extending from the first and second board members and bent in the optical axis direction; fifth and sixth board members extending from the third and fourth board members and bent in the first direction; and seventh and eighth board members extending from the fifth and sixth board members and bent in the second direction.

In this case, the flexible circuit board may be configured such that the fifth and sixth board members and the seventh and eighth board members are separated from one another.

In addition, the first and second board members may move in the optical axis direction as the image sensor moves.

In addition, the third and fourth board members may move in the first direction as the image sensor moves.

In addition, the fifth and sixth board members may move in the second direction as the image sensor moves.

In addition, the sensor-driving actuator of the present invention may further include: a middle guide provided between the OIS carrier and the AF carrier.

In this case, the OIS carrier may include first and second magnets, and the first housing may include: a first drive coil facing the first magnet; and a second drive coil facing the second magnet.

In addition, the sensor-driving actuator of the present invention may further include: a first guide rail formed in the second direction on an upper portion of the OIS carrier; a second guide rail formed on a lower portion of the middle guide and facing the first guide rail; and a first OIS ball provided between the first and second guide rails.

In addition, the sensor-driving actuator of the present invention may further include: a third guide rail formed in the first direction on an upper portion of the middle guide; a fourth guide rail formed on a lower portion of the AF carrier and facing the third guide rail; and a second OIS ball provided between the third and fourth guide rails.

In addition, the AF carrier may include a third magnet, and the first housing may include a third drive coil facing the third magnet.

In addition, the sensor-driving actuator of the present invention may further include: a fifth guide rail formed in the optical axis direction on an outer portion of the AF carrier; a sixth guide rail formed on an inner portion of the housing and facing the fifth guide rail; and an AF ball provided between the fifth and sixth guide rails.

Advantageous Effects

According to the present invention, the actuator corrects the hand shake problem and implements autofocusing by moving the image sensor, which is relatively light in weight, instead of moving the lens module, which accounts for most of the weight of the camera module. Therefore, it is possible to comparatively easily implement the OIS and AF and improve reliability of the camera module.

In addition, according to the present invention, the flexible circuit board has the structure bent in the three axial directions, which makes it possible to minimize tension (load) applied to the flexible circuit board by the movement of the image sensor at the time of implementing the OIS and AF. Therefore, it is possible to facilitate the movement of the image sensor.

The effects capable of being obtained by the present invention are not limited to the aforementioned effects, and other effects, which are not mentioned above, will be clearly understood by those skilled in the art from the following description.

DETAILED DESCRIPTION OF THE EMBODIMENTS

Figure 1:
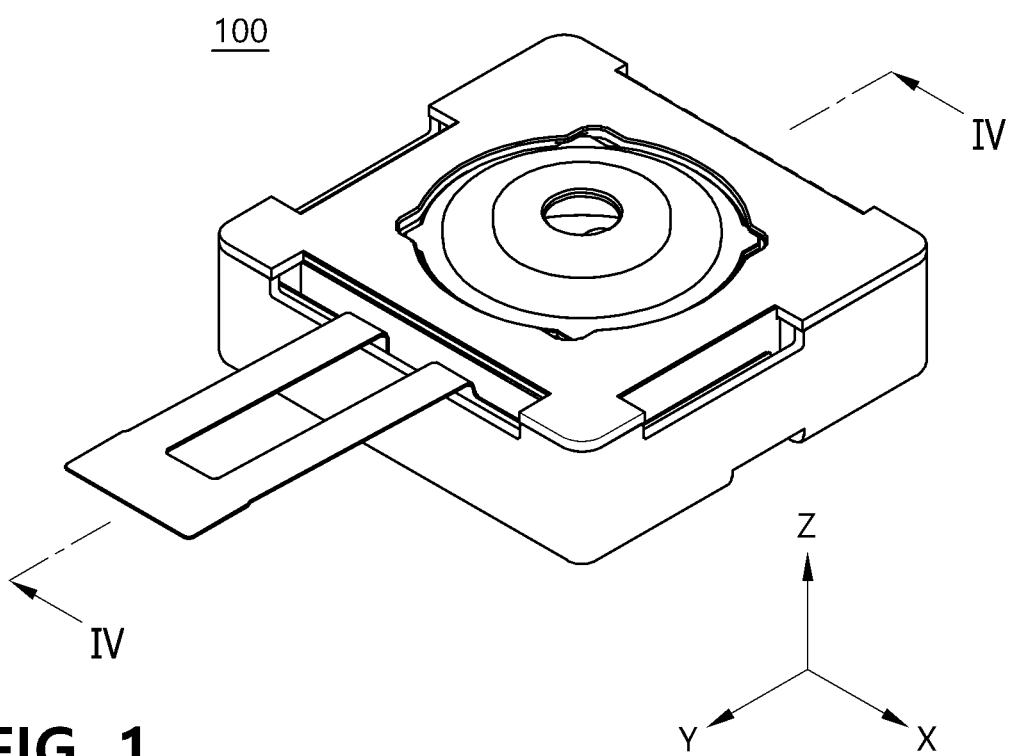
FIG. 1 is a perspective view of a sensor-driving actuator according to an embodiment of the present invention.

Hereinafter, exemplary embodiments of the present invention will be described in detail with reference to the accompanying drawings. In addition, terms or words used in the specification and the claims should not be interpreted as being limited to a general or dictionary meaning and should be interpreted as a meaning and a concept which conform to the technical spirit of the present invention based on a principle that an inventor can appropriately define a concept of a term in order to describe his/her own invention by the best method.

Therefore, the exemplary embodiments disclosed in the present specification and the configurations illustrated in the drawings are just the best preferred exemplary embodiments of the present invention and do not represent all the technical spirit of the present invention. Accordingly, it should be appreciated that various equivalents and modified examples capable of substituting the exemplary embodiments may be made at the time of filing the present application.

Figure 2:
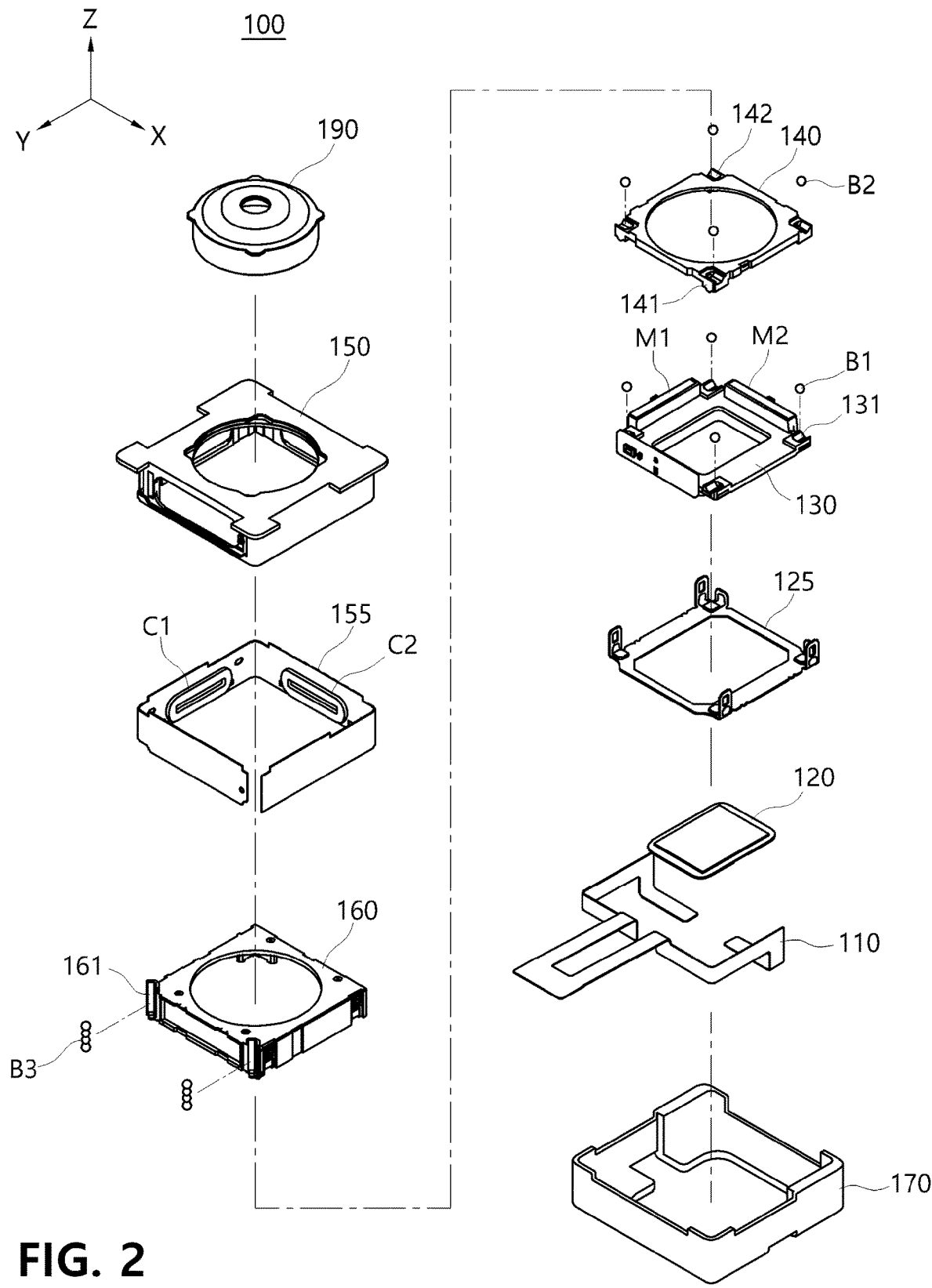
FIGS. 2 and 3 are exploded coupled views illustrating a configuration of the actuator according to the embodiment of the present invention.
Figure 3:
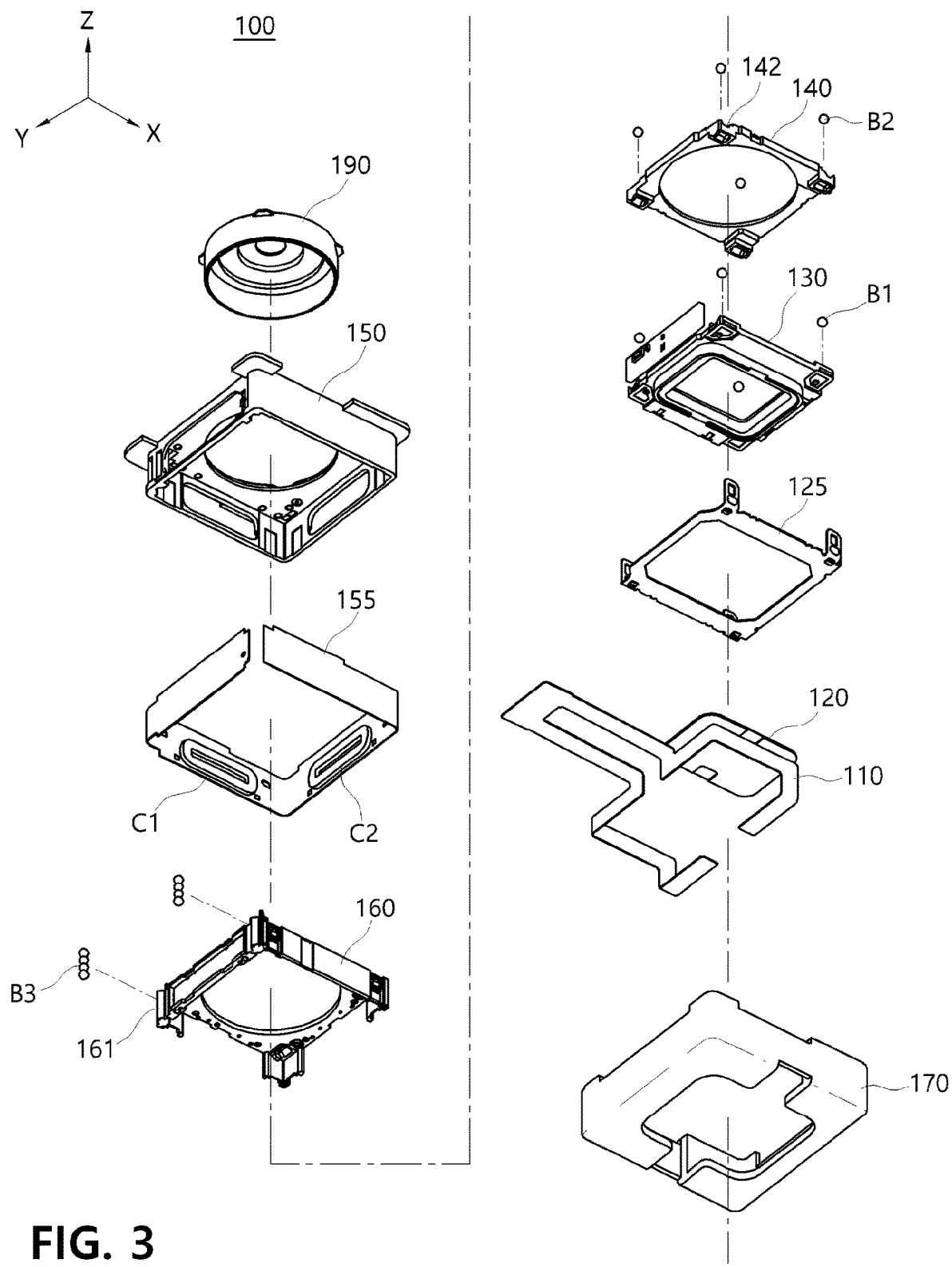
Figure 4:
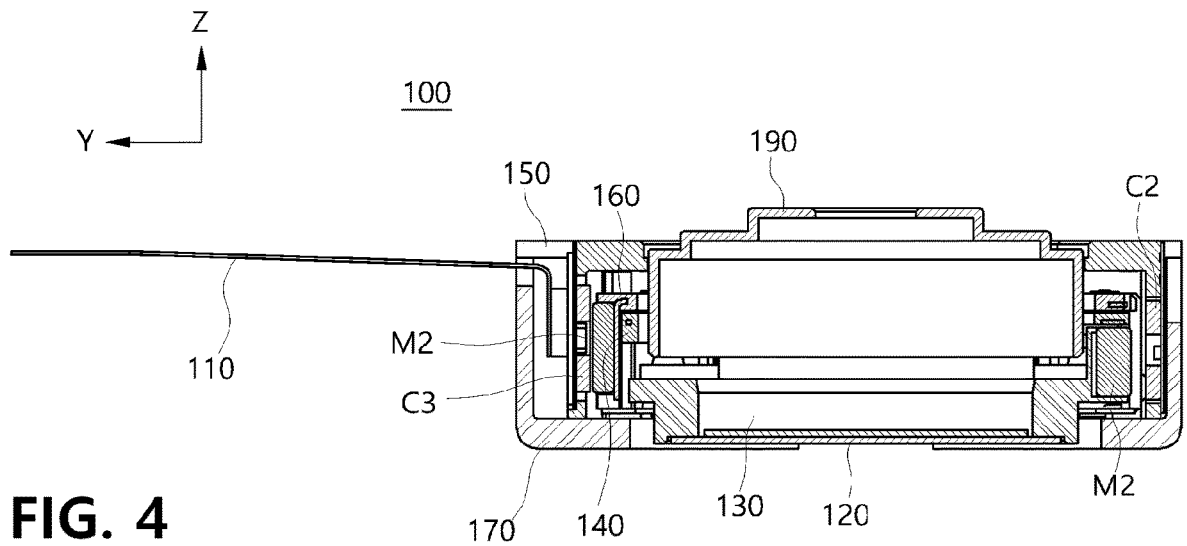
FIG. 4 is a cross-sectional view taken along cutting line IV-IV in FIG. 1.
Figure 5:
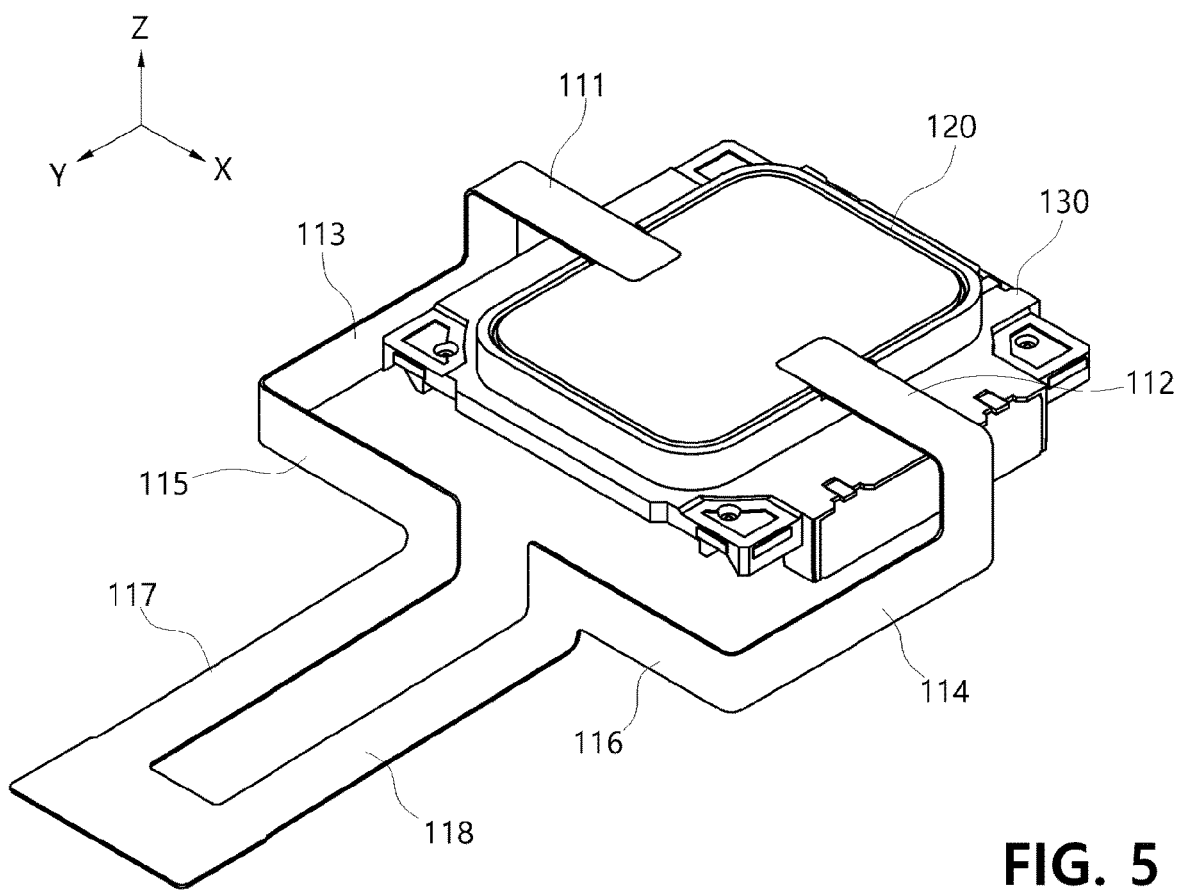
FIG. 5 is a view illustrating a state in which a flexible circuit board is mounted on an image sensor according to the embodiment of the present invention.
Figure 6:
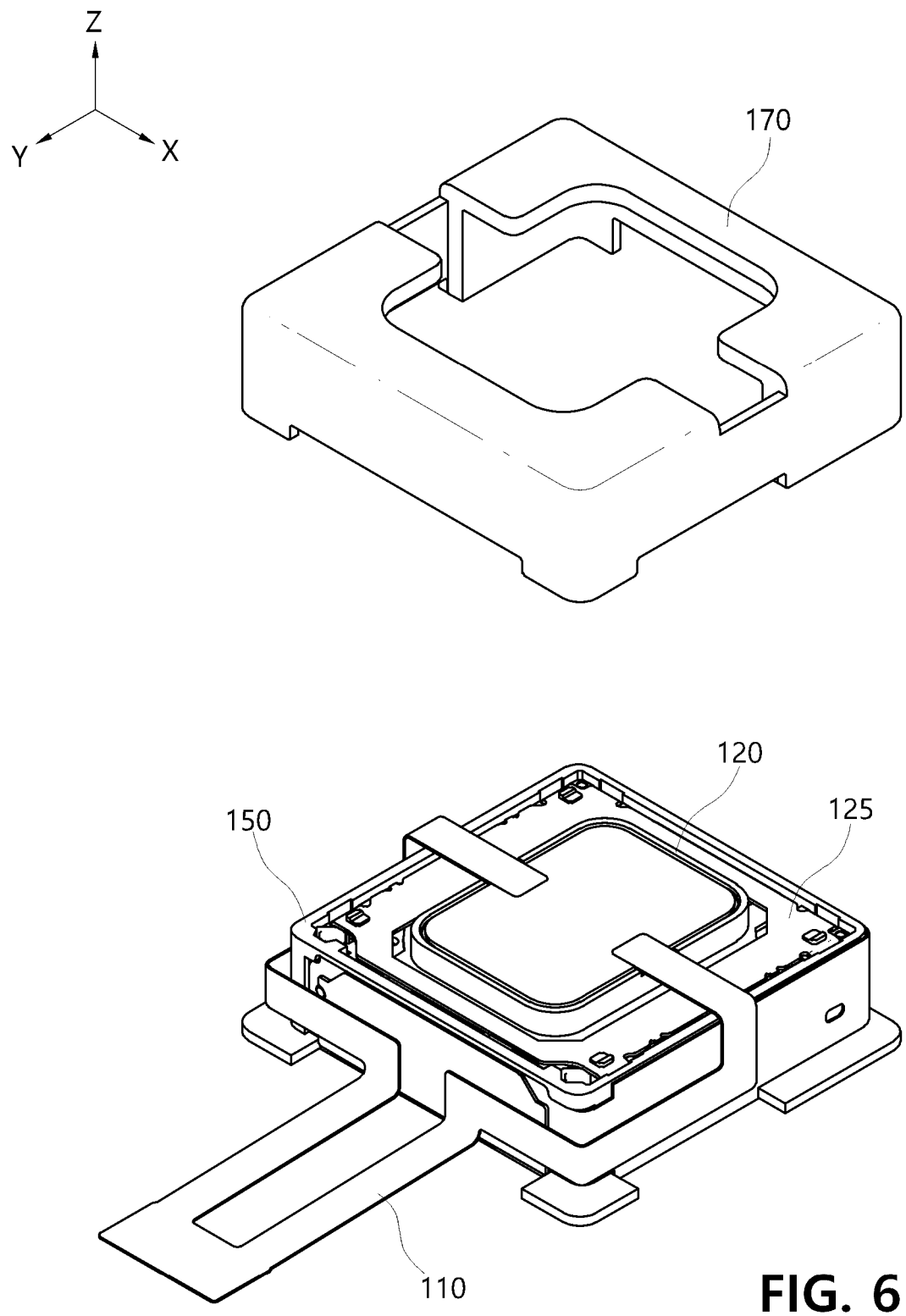
FIG. 6 is a view illustrating a state in which the flexible circuit board according to the embodiment of the present invention is disposed between first and second housings.

FIG. 1 is a perspective view of a sensor-driving actuator (hereinafter, referred to as an 'actuator') according to an embodiment of the present invention, and FIGS. 2 and 3 are exploded coupled views illustrating a configuration of the actuator according to the embodiment of the present invention. Further, FIG. 4 is a cross-sectional view taken along cutting line IV-IV in FIG. 1, and FIG. 5 is a view illustrating a state in which a flexible circuit board is mounted on an image sensor according to the embodiment of the present invention. Further, FIG. 6 is a view illustrating a state in which the flexible circuit board according to the embodiment of the present invention is disposed between first and second housings.

Hereinafter, an overall configuration of the actuator of the present invention will be described first with reference to FIGS. 1 to 6, and then detailed descriptions of embodiments of the present invention for implementing AF and OIS functions will be described below.

An actuator 100 according to an embodiment of the present invention is an embodiment in which both autofocus (AF) and optical image stabilization (OIS) are implemented together by driving an image sensor 120. However, the actuator 100 of the present invention may, of course, be implemented as an actuator operated only for the OIS.

AZ-axis direction illustrated in the drawings is the optical axis direction that is a direction in which light is introduced into a lens module 190. The Z-axis direction corresponds to a direction in which an AF carrier 160 to be described below moves forward or rearward. Further, the optical axis means a central axis of the image sensor 120.

Further, an X-axis direction and a Y-axis direction, which are directions perpendicular to the optical axis direction (Z-axis direction), mean directions in which the image sensor 120 is moved by OIS driving to compensate for swaying caused by a hand shake problem. In the following description, the X-axis direction is referred to as a first direction, and the Y-axis direction is referred to as a second direction. However, the X-axis and Y-axis directions are only one example from a relative standpoint. Of course, any one of the X-axis direction and the Y-axis direction may be the first direction, and the other of the X-axis direction and the Y-axis direction may be the second direction.

The actuator 100 according to the embodiment of the present invention may include a flexible circuit board 110, the image sensor 120, a stopper 125, an OIS carrier 130, a middle guide 140, a first housing 150, the AF carrier 160, a second housing 170, and the lens module 190.

The actuator 100 according to the embodiment of the present invention may have a structure in which the OIS carrier 130, the middle guide 140, the AF carrier 160, the first housing 150, and the lens module 190 are sequentially coupled based on the second housing 170.

The image sensor 120 is mounted on the OIS carrier 130, and the middle guide 140 is disposed above the OIS carrier 130. In this case, the OIS carrier 130 and the middle guide 140 are accommodated in the AF carrier 160. Further, the AF carrier 160 is accommodated in the first housing 150.

Therefore, the OIS carrier 130 may move in at least one of the first and second directions in the AF carrier 160. The AF carrier 160 may move in the optical axis direction in the first housing 150.

In this case, because the OIS carrier 130 is accommodated in the AF carrier 160, the OIS carrier 130 may move together with the AF carrier 160 when the AF carrier 160 moves.

Unlike the configuration illustrated in the drawings, the image sensor 120 may be mounted on the AF carrier 160, and the AF carrier 160 may be accommodated in the OIS carrier 130. In this case, the middle guide 140 is disposed above the OIS carrier 130, and the OIS carrier 130 is accommodated in the first housing 150.

Therefore, the AF carrier 160 may move in the optical axis direction in the OIS carrier 130. The OIS carrier 130 may move in at least one of the first and second directions in the first housing 150.

In this case, because the AF carrier 160 is accommodated in the OIS carrier 130, the AF carrier 160 may move together with the OIS carrier 130 when the OIS carrier 130 moves.

The OIS carrier 130 has first and second magnets M1 and M2, and the AF carrier 160 has a third magnet. Further, the first housing 150 has first to third drive coils C1, C2, and C3 that face the first to third magnets.

In this case, the first to third drive coils C1, C2, and C3 may be mounted on a substrate 155 and provided on an inner peripheral surface of the first housing 150.

The OIS carrier 130 has an opening portion formed at a center thereof to expose the image sensor 120 in the optical axis direction. Therefore, the image sensor 120 may detect light entering from the lens module 190.

In this case, the image sensor 120 may include an image capturing element such as a charged-coupled device (CCD) and a complementary metal-oxide semiconductor (CMOS).

When the AF carrier 160 moves forward or rearward in the optical axis direction, the image sensor 120 provided at a rear end of the actuator 100 also moves forward or rearward in the optical axis direction, such that a focal length between the image sensor 120 and the lens module 190 is adjusted, and the AF function is implemented. The detailed description thereof will be described below.

The middle guide 140 is provided between the OIS carrier 130 and the AF carrier 160.

A first guide rail 131 is formed in the second direction on an upper portion of the OIS carrier 130, and a second guide rail 141 is formed on a lower portion of the middle guide 140 and faces the first guide rail 131. Further, a first OIS ball B1 is provided between the first and second guide rails 131 and 141.

A third guide rail 142 is formed in the first direction on an upper portion of the middle guide 140, and a fourth guide rail is formed on a lower portion of the AF carrier 160 and faces the third guide rail 142. Further, a second OIS ball B2 is provided between the third 142 and fourth guide rails.

A fifth guide rail 161 is formed in the optical axis direction on an outer portion of the AF carrier 160, and a sixth guide rail (not illustrated) is formed on an inner portion of the first housing 150 and faces the fifth guide rail 161. Further, an AF ball B3 is provided between the fifth guide rail 161 and the sixth guide rail (not illustrated).

The stopper 125 serves to restrict a downward movement of the AF carrier 160 in the optical axis direction.

The lens module 190 may be fixed to the first housing 150. As described above, the actuator 100 according to the embodiment of the present invention may implement both the OIS and AF functions by moving the image sensor 120 along three axes in a state in which the lens module 190 is fixed.

The flexible circuit board 110 is attached to centers of two opposite sides of the image sensor 120. In this case, the flexible circuit board 110 may be a printed circuit board configured to transmit an electrical signal to the image sensor 120 and receive an electrical signal from the image sensor 120. Further, the second housing 170 accommodates the first housing 150.

With reference to FIGS. 5 and 6, the flexible circuit board 110 is attached to the centers of the two opposite sides of the image sensor 120 and bent in the optical axis direction and the first and second directions along an outer surface of the first housing 150. However, this is provided for illustrative purposes only. The flexible circuit board may be applied as an FPCB structure bent in the optical axis direction and the direction perpendicular to the optical axis.

Specifically, the flexible circuit board 110 may include first and second board members 111 and 112 attached to two opposite sides of the image sensor 120, third and fourth board members 113 and 114 respectively extending from the first and second board members 111 and 112 and bent in the optical axis direction, fifth and sixth board members 115 and 116 respectively extending from the third and fourth board members 113 and 114 and bent in the first direction, and seventh and eighth board members 117 and 118 respectively extending from the fifth and sixth board members 115 and 116 and bent in the second direction.

At least a part of the flexible circuit board 110 may be disposed between an outer surface of the first housing 150 and an inner surface of the second housing 170. Further, a movement space, in which the flexible circuit board 110 may move, may be provided between the outer surface of the first housing 150 and the inner surface of the second housing 170.

Therefore, when the image sensor 120 moves, the flexible circuit board 110 may move in at least one of the optical axis direction and the first and second directions in the movement space between the outer surface of the first housing 150 and the inner surface of the second housing 170. The detailed description thereof will be described below.

The flexible circuit board 110 may be configured such that the fifth and sixth board members 115 and 116 and the seventh and eighth board members 117 and 118 are separated from one another. Further, the second housing 170 may have a slit through which the seventh and eighth board members 117 and 118 may be exposed to the outside in the second direction.

Figure 7:
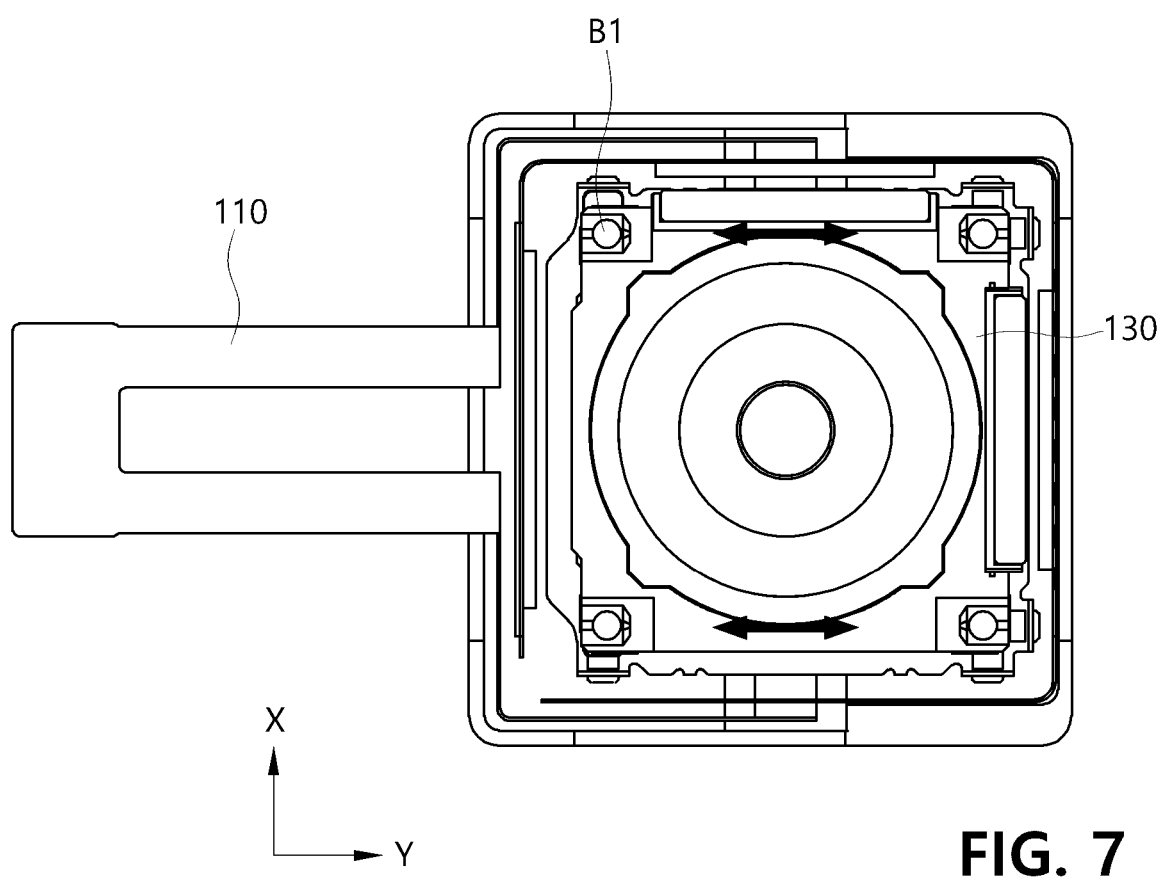
FIG. 7 is a view for explaining an X-axis direction OIS function of the actuator according to the embodiment of the present invention.
Figure 8:
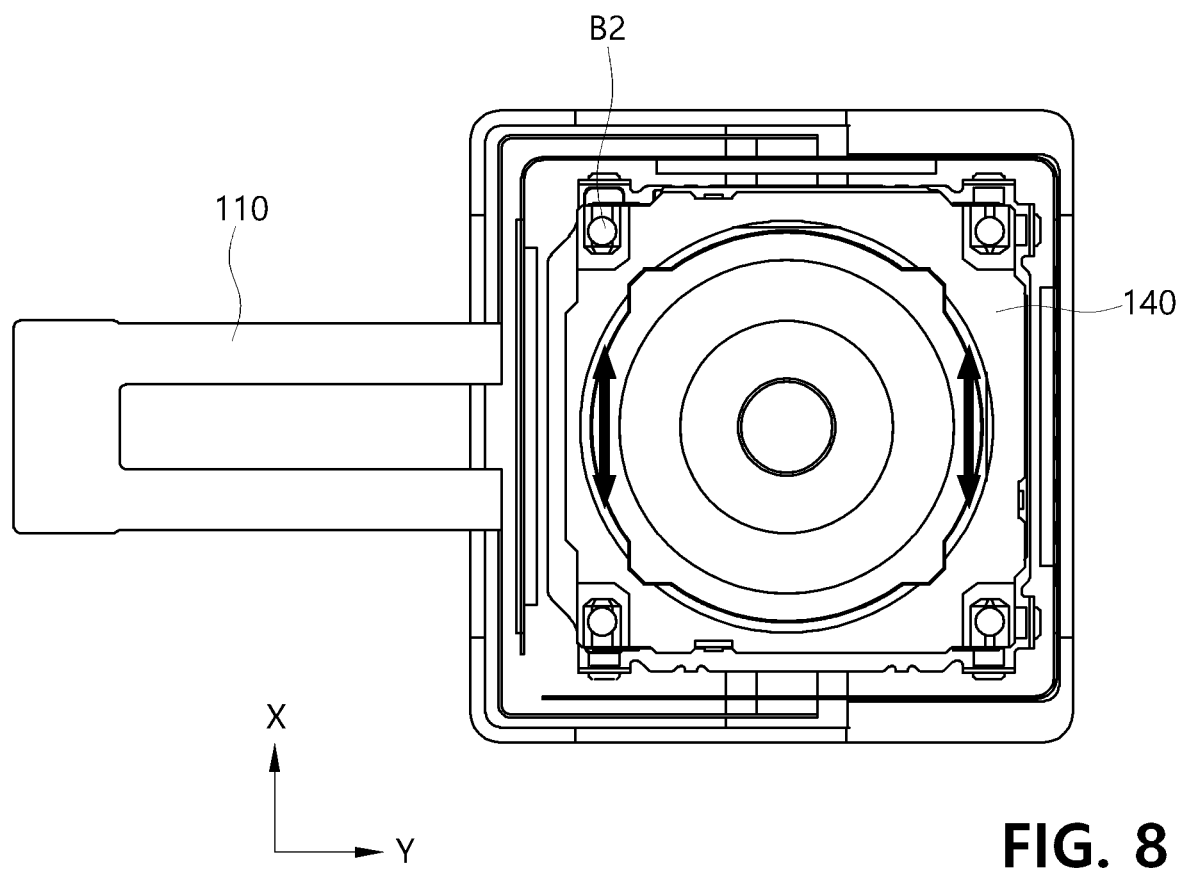
FIG. 8 is a view for explaining a Y-axis direction OIS function of the actuator according to the embodiment of the present invention.

FIG. 7 is a view for explaining an X-axis direction OIS function of the actuator according to the embodiment of the present invention, and FIG. 8 is a view for explaining a Y-axis direction OIS function of the actuator according to the embodiment of the present invention.

With reference to FIG. 7, the actuator 100 according to the embodiment of the present invention includes the first guide rail 131 formed in the second direction (Y-axis direction) on the upper portion of the OIS carrier 130, the second guide rail 141 formed on the lower portion of the middle guide 140 and facing the first guide rail 131, and the first OIS ball B1 provided between the first and second guide rails 131 and 141.

The first OIS ball B1 may roll between the first and second guide rails 131 and 141 and move the OIS carrier 130 in the second direction.

The first guide rail 131 may be formed at each corner of the OIS carrier 130, and the second guide rail 141 may also be formed at each corner of the middle guide 140. However, the present invention is not limited thereto.

The first magnet M1 is installed uprightly on the upper portion of the OIS carrier 130 and disposed in the second direction between the two first OIS balls B1.

The first drive coil C1 is disposed on an inner surface of the first housing 150 and faces the first magnet M1. In this case, a Hall sensor may be disposed inside the first drive coil C1.

To implement the OIS function in the second direction (Y-axis direction), the OIS carrier 130 moves in the second direction in the internal space of the AF carrier 160 based on the base.

The Hall sensor may transmit an electrical signal, which corresponds to a direction and size of a motion made by a hand shake problem, to an operation driver (not illustrated). The operation driver may perform control to apply electric power, which has a magnitude and direction corresponding to the electrical signal, to the first drive coil C1. That is, the OIS carrier 130 may be moved by feedback control between the Hall sensor and the operation driver.

When the electric power is applied to the first drive coil C1, the first drive coil C1 generates an electromagnetic force on the first magnet M1 installed on the OIS carrier 130, and the first OIS ball B1 is rolled between the first and second guide rails 131 and 141 by the electromagnetic force, such that the OIS carrier 130 moves in the second direction.

In this case, because the image sensor 120 is coupled to the OIS carrier 130, the image sensor 120 also moves in the second direction when the OIS carrier 130 moves in the second direction. Therefore, the hand shake problem is corrected by components in the second direction.

With reference to FIG. 8, the actuator 100 according to the embodiment of the present invention includes the third guide rail 142 formed in the first direction (X-axis direction) on the upper portion of the middle guide 140, the fourth guide rail formed on the lower portion of the AF carrier 160 and facing the third guide rail 142, and the second OIS ball B2 is provided between the third 142 and fourth guide rails.

The second OIS ball B2 may move the middle guide 140 in the first direction while rolling between the third 142 and fourth guide rails.

The third guide rail 142 may be formed at each corner of the middle guide 140, and the fourth guide rail may also be at each corner of the AF carrier 160. However, the present invention is not limited thereto.

The second magnet M2 is installed uprightly on the upper portion of the OIS carrier 130 and disposed in the first direction between the two second OIS balls B2.

The second drive coil C2 may be disposed on the inner surface of the first housing 150 and face the second magnet M2, and a Hall sensor may be disposed inside the second drive coil C2.

To implement the OIS function in the first direction (X-axis direction), the idle guide 140 moves in the first direction in the internal space of the AF carrier 160 based on the base.

The Hall sensor transmits an electrical signal, which corresponds to a direction and size of a motion made by a hand shake problem, to an operation driver (not illustrated). The operation driver performs control to apply electric power, which has a magnitude and direction corresponding to the electrical signal, to the second drive coil C2. That is, the middle guide 140 may be moved by feedback control between the Hall sensor and the operation driver.

When the electric power is applied to the second drive coil C2, the second drive coil C2 generates an electromagnetic force on the second magnet M2 installed on the OIS carrier 130, and the second OIS ball B2 is rolled between the third 142 and fourth guide rails by the electromagnetic force, such that the middle guide 140 moves in the first direction.

In this case, the image sensor 120 is coupled to the OIS carrier 130, and the OIS carrier 130 is coupled to the middle guide 140, such that the OIS carrier 130 and the image sensor 120 also move in the first direction when the middle guide 140 moves in the first direction. Therefore, the hand shake problem is corrected by components in the first direction.

As described above, the actuator 100 according to the embodiment of the present invention corrects the hand shake problem by moving the image sensor 120, which is relatively light in weight, instead of moving the lens module 190, which accounts for most of the weight of the camera module. Therefore, it is possible to comparatively easily implement the OIS and improve reliability of the camera module.

Figure 9:
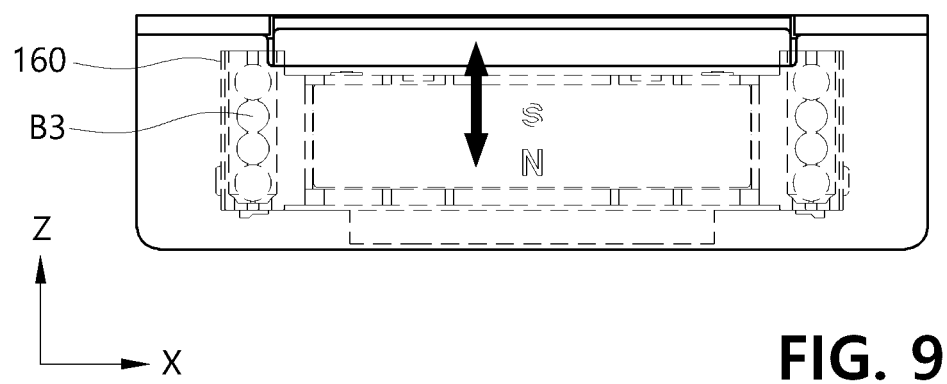
FIG. 9 is a view for explaining an optical axis direction AF function of the actuator according to the embodiment of the present invention.

FIG. 9 is a view for explaining an optical axis direction AF function of the actuator according to the embodiment of the present invention.

With reference to FIG. 9, the actuator 100 according to the embodiment of the present invention includes the fifth guide rail 161 formed in the optical axis direction (Z-axis direction) on the outer portion of the AF carrier 160, the sixth guide rail (not illustrated) formed on the inner portion of the first housing 150 and facing the fifth guide rail 161, and the AF ball B3 provided between the fifth guide rail 161 and the sixth guide rail (not illustrated).

The AF ball B3 may roll between the fifth guide rail 161 and the sixth guide rail (not illustrated) and move the AF carrier 160 in the optical axis direction.

The fifth guide rails 161 may be formed at two opposite sides of an outer surface of the AF carrier 160 on which the third magnet is provided.

The third magnet may be provided between the fifth guide rails 161. The third drive coil C3 may be disposed on the inner surface of the first housing 150 and faces the third magnet. A Hall sensor may be disposed inside the third drive coil C3.

The AF carrier 160 may be moved by feedback control between the Hall sensor and the operation driver.

The first housing 150 may provide a movement space for the AF carrier 160. Further, the AF carrier 160 is provided in the first housing 150 and moves in the optical axis direction (Z-axis direction) based on the base 110.

When the electric power with an appropriate magnitude and direction is applied to the third drive coil C3, the third coil C3 generates an electromagnetic force on the third magnet installed on the AF carrier 160, and the AF ball B3 is rolled between the fifth guide rail 161 and the sixth guide rail (not illustrated) by the electromagnetic force, such that the AF carrier 160 moves in the optical axis direction.

The AF carrier 160 accommodates the OIS carrier 130, and the OIS carrier 130 is coupled to the image sensor 120, such that the OIS carrier 130 and the image sensor 120 may also move in the optical axis direction when the AF carrier 130 moves in the optical axis direction. Therefore, the focal length between the lens module 190 and the image sensor 120 is adjusted.

The movement of the OIS carrier 130 in the first and second directions and the movement of the AF carrier 160 in the optical axis direction are independently performed by separate processes and separate physical structures. Therefore, the movements in the respective directions may be independently performed. Alternatively, the movements in the plurality of combinations of the directions (XY, XZ, YZ, XYZ, and the like) may, of course, be simultaneously performed.

According to the actuator 100 according to the embodiment of the present invention described above, the first to third magnets and the first to third drive coils C1, C2, and C3 are disposed uprightly in the optical axis direction, such that a thickness (based on the optical axis direction) of the actuator 100 may be significantly reduced.

Recently, a width of a main substrate has been sufficiently increased in accordance with an increase in width of a screen display means of a portable terminal. Because the actuator 100 of the present invention increases in size only in a width direction, which is a horizontal direction based on the optical axis, it is possible to implement a structure that more properly conforms to the trend of the portable terminal.

Figure 10:
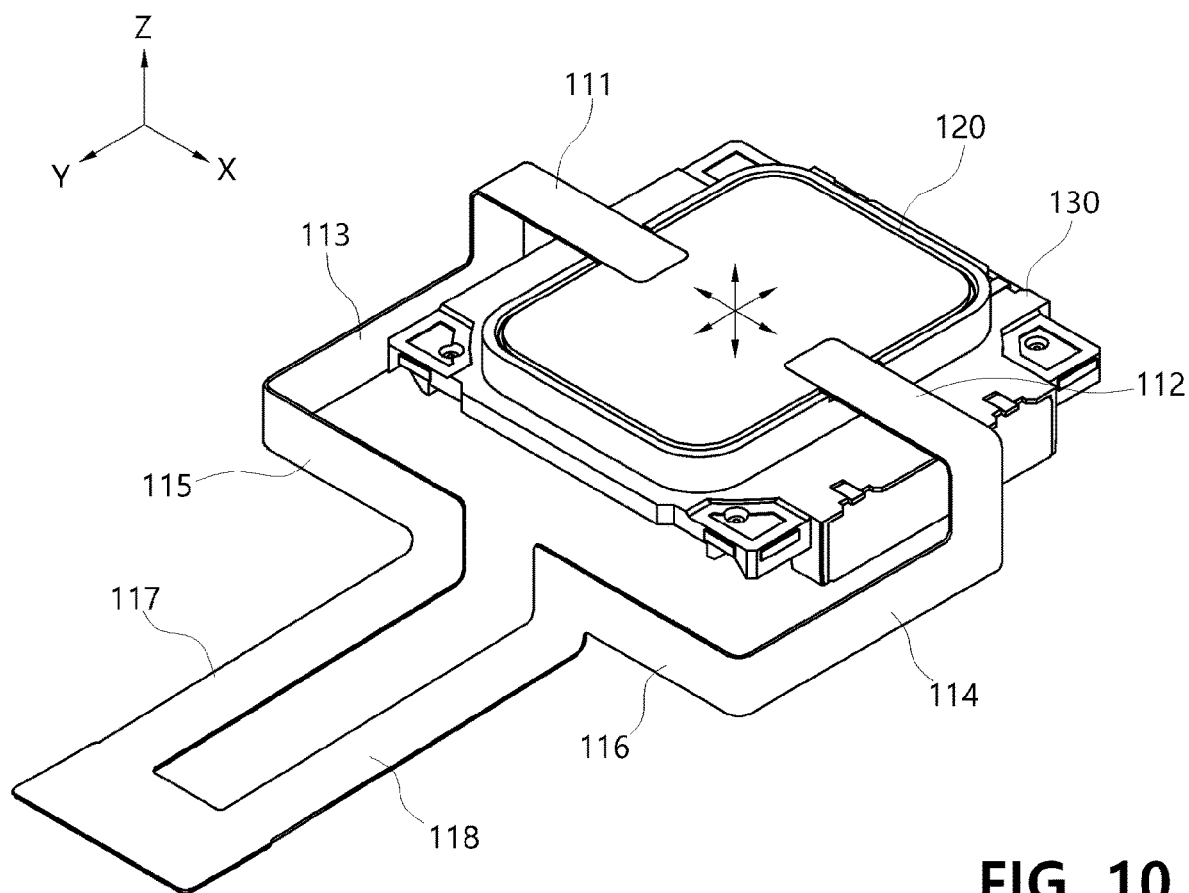
FIG. 10 is a view for explaining a function of the flexible circuit board according to the embodiment of the present invention.

FIG. 10 is a view for explaining a function of the flexible circuit board according to the embodiment of the present invention.

The first and second board members 111 and 112 may be attached to two opposite sides of the image sensor 120, and the third to sixth board members 113, 114, 115, and 116 may be disposed in the movement space provided between the outer surface of the first housing 150 and the inner surface of the second housing 170. Further, the fifth and sixth board members 115 and 116 and the seventh and eighth board members 117 and 118 may be separated from one another and at least partially exposed to the outside of the first and second housings 150 and 170.

In this case, the first and second board members 111 and 112 serve to facilitate the movement of the image sensor 120 in the optical axis direction. Further, the third and fourth board members 113 and 114 serve to facilitate the movement of the image sensor 120 in the first direction, and the fifth and sixth board members 115 and 116 serve to facilitate the movement of the image sensor 120 in the second direction.

With reference to FIG. 10, in case that the image sensor 120 moves in the optical axis direction as the AF function in the optical axis direction is implemented, the first and second board members 111 and 112 also move in the optical axis direction as the image sensor 120 moves.

That is, the first and second board members 111 and 112 are attached to the image sensor 120, and the image sensor 120 is mounted on the OIS carrier 130. Therefore, when the image sensor 120 is moved in the optical axis direction by the operation of the OIS carrier 130, the first and second board members 111 and 112 may move in the optical axis direction as the image sensor 120 moves.

In this case, the first and third board members 111 and 113 and the second and fourth board members 112 and 114 each have a structure bent in the optical axis direction. Therefore, it is possible to minimize tension (load) applied to the first and second board members 111 and 112 when the first and second board members 111 and 112 move. Therefore, it is possible to facilitate the movement of the image sensor 120 in the optical axis direction.

In addition, with reference to FIG. 10, in case that the image sensor 120 moves in the first direction as the OIS function in the first direction is implemented, the third and fourth board members 113 and 114 also move in the first direction in the movement space as the image sensor 120 moves.

That is, the first and second board members 111 and 112 are attached to the image sensor 120, and the image sensor 120 is mounted on the OIS carrier 130. Therefore, when the image sensor 120 is moved in the first direction by the operation of the OIS carrier 130, the third and fourth board members 113 and 114 may move in the first direction in the movement space, which is provided between the first and second housings 150 and 170, as the image sensor 120 moves.

In this case, the first and third board members 111 and 113 and the second and fourth board members 112 and 114 each have a structure bent in the optical axis direction, and the third and fifth board members 113 and 115 and the fourth and sixth board members 114 and 116 each have a structure bent in the first direction. Therefore, it is possible to minimize tension (load) applied to the third and fourth board members 113 and 114 when the third and fourth board members 113 and 114 move. Therefore, it is possible to facilitate the movement of the image sensor 120 in the first direction.

In addition, the fifth and sixth board members 115 and 116 and the seventh and eighth board members 117 and 118 are separated from one another, which makes it possible to further minimize tension (load) applied to the third and fourth board members 113 and 114 when the third and fourth board members 113 and 114 move. Therefore, it is possible to further facilitate the movement of the image sensor 120 in the first direction.

In addition, with reference to FIG. 10, in case that the image sensor 120 moves in the second direction as the OIS function in the second direction is implemented, the fifth and sixth board members 115 and 116 also move in the second direction in the movement space as the image sensor 120 moves.

That is, the first and second board members 111 and 112 are attached to the image sensor 120, and the image sensor 120 is mounted on the OIS carrier 130. Therefore, when the image sensor 120 is moved in the second direction by the operation of the OIS carrier 130, the fifth and sixth board members 115 and 116 may move in the second direction in the movement space, which is provided between the first and second housings 150 and 170, as the image sensor 120 moves.

In this case, the third and fifth board members 113 and 115 and the fourth and sixth board members 114 and 116 each have a structure bent in the first direction, and the fifth and seventh board members 115 and 117 and the sixth and eighth board members 116 and 118 each have a structure bent in the second direction. Therefore, it is possible to minimize tension (load) applied to the fifth and sixth board members 115 and 116 when the fifth and sixth board members 115 and 116 move. Therefore, it is possible to facilitate the movement of the image sensor 120 in the second direction.

In addition, the fifth and sixth board members 115 and 116 and the seventh and eighth board members 117 and 118 are separated from one another, which makes it possible to further minimize tension (load) applied to the fifth and sixth board members 115 and 116 when the fifth and sixth board members 115 and 116 move. Therefore, it is possible to further facilitate the movement of the image sensor 120 in the second direction.

The present invention has been described with reference to the limited embodiments and the drawings, but the present invention is not limited thereto. The described embodiments may be changed or modified by those skilled in the art to which the present invention pertains within the technical spirit of the present invention and within the scope equivalent to the appended claims.

In the above-mentioned description of the present invention, the modifies such as first and second are only instrumentally conceptual terms used to distinguish relatively constituent elements from one another and should not be construed as terms used to indicate any particular order, priority, or the like.

The description of the present invention and the accompanying drawings attached for the purpose of illustrating the embodiments may be somewhat exaggerated to emphasize or highlight the technical contents according to the present invention technology. However, it should be interpreted that various modified applications may be made at the level of those skilled in the art in consideration of the contents disclosed and illustrated in the description and drawings.

INDUSTRIAL APPLICABILITY

The sensor-driving actuator according to the present invention may be applied to stand-alone camera devices as well as camera modules and the like mounted in mobile terminals such as mobile phones and smartphones.

The invention claimed is:

1. A sensor-driving actuator, comprising:
an image sensor;
an optical image stabilization (OIS) carrier mounted with the image sensor and configured to move the image sensor in at least one of a first direction and a second direction, wherein the first direction is perpendicular to an optical axis direction, and the second direction is perpendicular to the first direction;
an autofocus (AF) carrier configured to move the image sensor in the optical axis direction;
a first housing configured to accommodate the OIS carrier and the AF carrier;
a flexible circuit board configured to transmit a first electrical signal to the image sensor and receive a second electrical signal from the image sensor, extend from an upper portion of the OIS carrier and be bent in the optical axis direction and the direction perpendicular to the optical axis direction along an outer surface of the first housing, wherein the flexible circuit board is configured to move as the image sensor moves; and
a second housing configured to accommodate the first housing;
wherein the flexible circuit board comprises:
first and second board members attached to two opposite sides of the image sensor;
third and fourth board members extending from the first and second board members and bent in the optical axis direction;
fifth and sixth board members extending from the third and fourth board members and bent in the first direction; and
seventh and eighth board members extending from the fifth and sixth board members and bent in the second direction.

2. The sensor-driving actuator of claim 1, wherein at least a part of the flexible circuit board is disposed between the outer surface of the first housing and an inner surface of the second housing.

3. The sensor-driving actuator of claim 2, wherein a movement space for the flexible circuit board is provided between the outer surface of the first housing and the inner surface of the second housing.

4. The sensor-driving actuator of claim 3, wherein the direction perpendicular to the optical axis direction includes the first direction and the second direction and the flexible circuit board moves in at least one of the optical axis direction, the first direction, and the second direction in the movement space as the image sensor moves.

5. The sensor-driving actuator of claim 1, wherein the flexible circuit board is configured such that the fifth and sixth board members are separated from one another and the seventh and eighth board members are separated from one another.

6. The sensor-driving actuator of claim 1, wherein the first and second board members move in the optical axis direction as the image sensor moves.

7. The sensor-driving actuator of claim 1, wherein the third and fourth board members move in the first direction as the image sensor moves.

8. The sensor-driving actuator of claim 1, wherein the fifth and sixth board members move in the second direction as the image sensor moves.

9. The sensor-driving actuator of claim 1, further comprising:
a middle guide provided between the OIS carrier and the AF carrier.

10. The sensor-driving actuator of claim 1, wherein the OIS carrier comprises a first magnet and a second magnet, and
wherein the first housing comprises:
a first drive coil facing the first magnet; and
a second drive coil facing the second magnet.

11. The sensor-driving actuator of claim 9, further comprising:

a first guide rail formed in the second direction on the upper portion of the OIS carrier;
a second guide rail formed on a lower portion of the middle guide and facing the first guide rail; and
a first OIS ball provided between the first guide rail and the second guide rail.

12. The sensor-driving actuator of claim 9, further comprising:
a third guide rail formed in the first direction on an upper portion of the middle guide;
a fourth guide rail formed on a lower portion of the AF carrier and facing the third guide rail; and
a second OIS ball provided between the third guide rail and the fourth guide rail.

13. The sensor-driving actuator of claim 1, wherein the AF carrier comprises a third magnet, and the first housing comprises a third drive coil facing the third magnet.

14. The sensor-driving actuator of claim 1, further comprising:
a fifth guide rail formed in the optical axis direction on an outer portion of the AF carrier;
a sixth guide rail formed on an inner portion of the first housing and facing the fifth guide rail; and
an AF ball provided between the fifth guide rail and the sixth guide rail.

* * * * *